United States Patent [19]

Ohshima

[11] Patent Number: 5,420,074
[45] Date of Patent: May 30, 1995

[54] METHOD FOR BURYING LOW RESISTANCE MATERIAL IN A CONTACT HOLE

[75] Inventor: Yoich Ohshima, Yokohama, Japan

[73] Assignee: Kabushiki Kaisha Toshiba, Kawasaki, Japan

[21] Appl. No.: 302,398

[22] Filed: Sep. 8, 1994

Related U.S. Application Data

[60] Continuation of Ser. No. 26,114, Mar. 2, 1993, abandoned, which is a division of Ser. No. 725,688, Jul. 3, 1991, abandoned.

[30] Foreign Application Priority Data

Jul. 5, 1990 [JP] Japan .................... 2-178082

[51] Int. Cl.⁶ .................... H01L 21/28; H01L 21/768
[52] U.S. Cl. .................... 437/193; 437/195; 437/200; 437/203; 748/DIG. 19
[58] Field of Search .............. 437/193, 195, 200, 201, 437/203; 748/DIG. 19, DIG. 147; 257/384, 385, 755, 756

[56] References Cited

U.S. PATENT DOCUMENTS

| | | | |
|---|---|---|---|
| 4,128,670 | 12/1978 | Gaensslen | 437/193 |
| 4,152,823 | 5/1979 | Hall | 437/193 |
| 4,333,099 | 6/1982 | Tanguay et al. | 357/67 |
| 4,577,396 | 3/1986 | Yamamoto et al. | 437/200 |
| 4,800,176 | 1/1989 | Kakumu et al. | 437/193 |
| 4,818,723 | 4/1989 | Yen | 437/200 |
| 4,833,519 | 5/1989 | Kawano et al. | 357/59 |
| 4,960,732 | 10/1990 | Dixit et al. | 437/190 |
| 4,977,098 | 12/1990 | Yu et al. | 437/31 |

FOREIGN PATENT DOCUMENTS

| | | | |
|---|---|---|---|
| 055161A1 | 6/1982 | European Pat. Off. | |
| 59-61033 | 4/1984 | Japan | 437/200 |
| 60-189221 | 9/1985 | Japan | 437/200 |
| 60-226174 | 11/1985 | Japan | 437/200 |
| 63-119548 | 5/1988 | Japan | 437/200 |
| 63-128732 | 6/1988 | Japan | 437/200 |
| 1-205525 | 8/1989 | Japan | |

OTHER PUBLICATIONS

Kozicki, M., et al., "Silicide formation on Polysilicon . . .", *J. Electrochem. Soc.*, vol. 136, No. 3, Mar. 1989, pp. 878-881.

*Primary Examiner*—T. N. Quach
*Attorney, Agent, or Firm*—Banner, Birch, McKie & Beckett

[57] ABSTRACT

In a method for burying a contact hole according to the present invention, first, a polycrystalline silicon film is formed on a region including a contact hole. Impurities are introduced into the polycrystalline silicon film. Next, a metal film is formed on the polycrystalline silicon film. Next, a polycrystalline silicon film is formed on the metal film. Impurities are introduced into the polycrystalline silicon film. Next, a metal film is formed on the polycrystalline silicon film. A polycrystalline silicon film is formed on the metal film, and the contact hole is completely buried. Thereafter, a heat treatment is performed, thereby the impurities are diffused to the above two polycrystalline silicon films and all or a part of the metal film is changed to a metal silicide film. Next, an etchback is performed, thereby the polycrystalline silicon film and the metal silicide film are kept in only the contact hole.

17 Claims, 8 Drawing Sheets

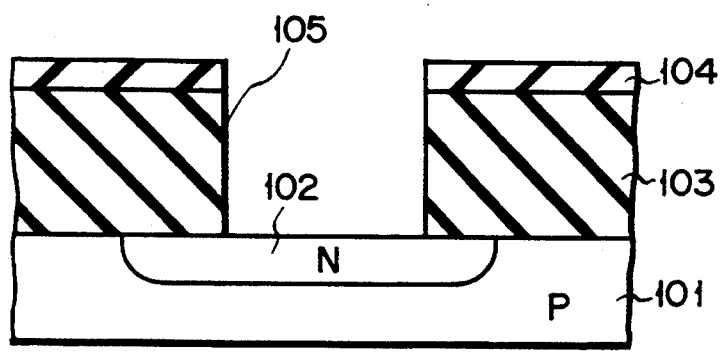
F I G. 2A
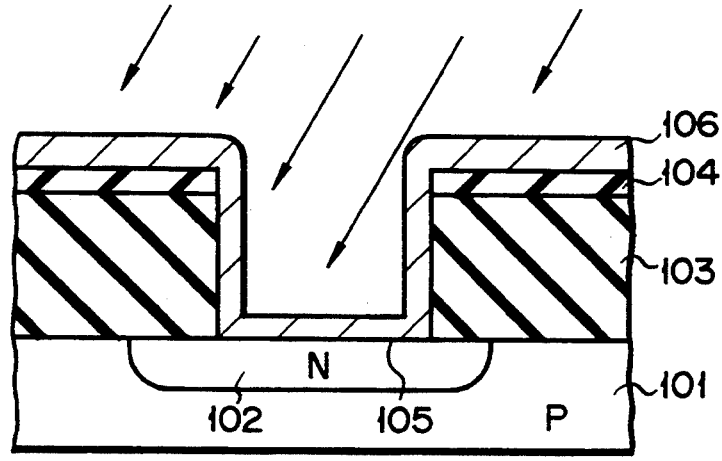
F I G. 2B
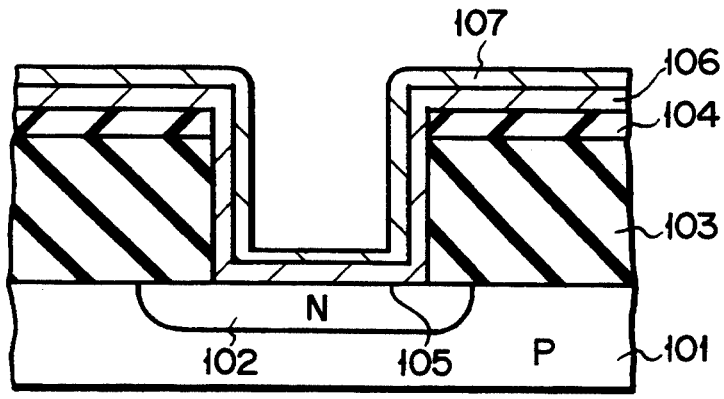
F I G. 2C

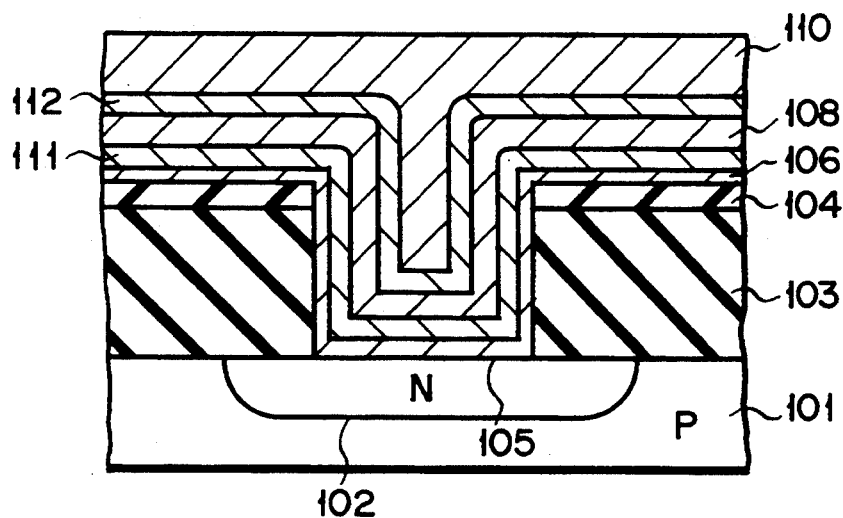
F I G. 2G
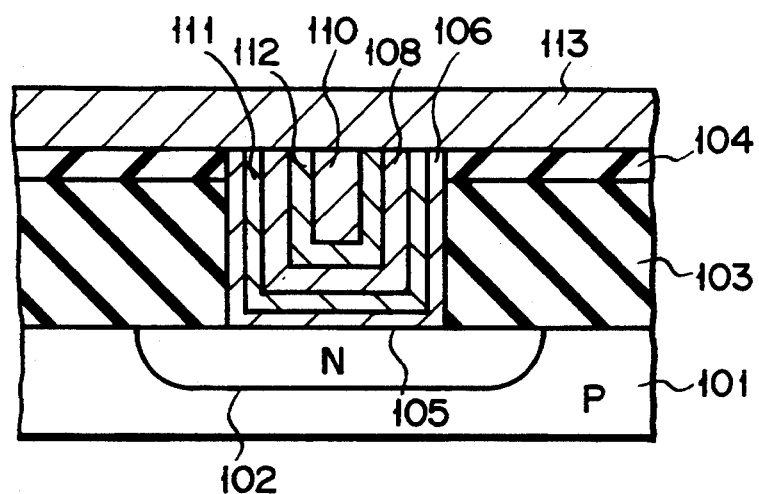
F I G. 2H

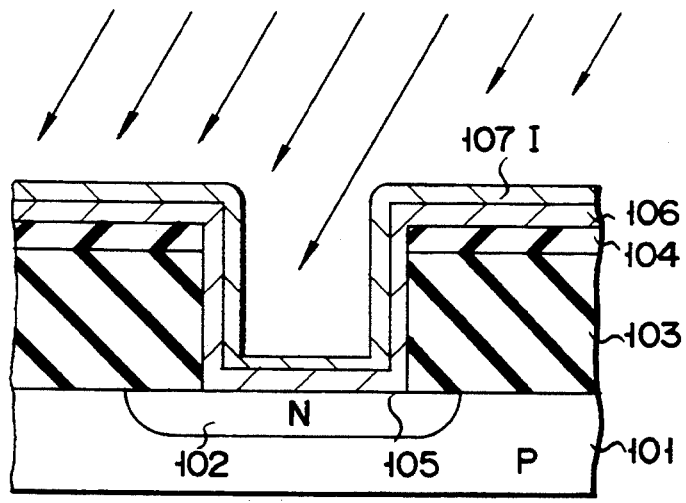
F I G. 6A
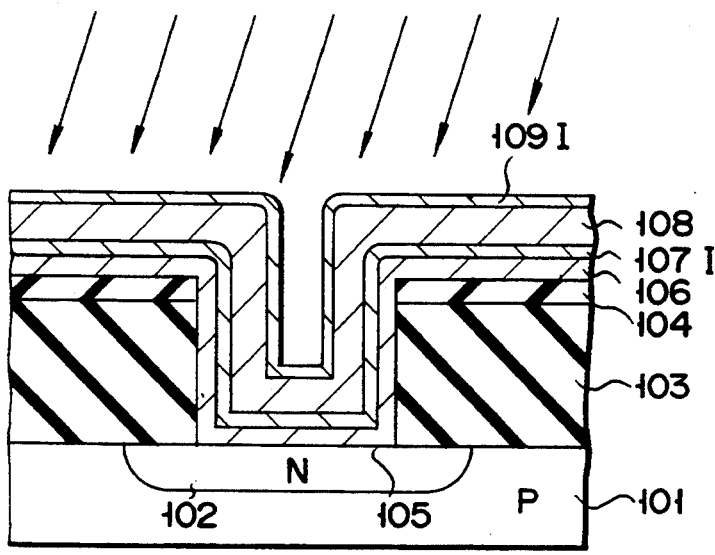
F I G. 6B
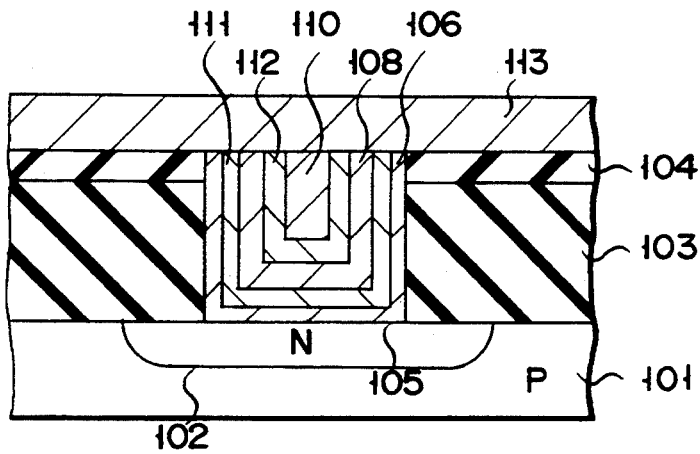
F I G. 6C

METHOD FOR BURYING LOW RESISTANCE MATERIAL IN A CONTACT HOLE

This application is a continuation of application Ser. No. 08/026,114, filed Mar. 2, 1993, now abandoned, which is a divisional of application Ser. No. 07/71,688, filed Jul. 3, 1991, now abandoned.

BACKGROUND OF THE INVENTION

1. Field of the Invention

The present invention relates to an improvement of a method for burying low resistance material in a contact hole.

2. Description of the Related Art

Conventionally, in a case where a metal wire is connected to a diffusion layer in a semiconductor substrate, the following methods are used.

An insulating layer is formed on the entire surface of the semiconductor substrate. A contact hole is formed in the insulating layer. Then, a metal film is formed by a sputtering method. Thereafter, the metal film is patterned, thereby forming a metal wire. However, in a case where the above method is used, the elements are integrated. Then, the step coverage of the metal wire in the contact hole worsens if an aspect ratio of the contact hole increases.

In recent years, much attention has been paid to a method for burying low resistance material (e.g., polycrystalline silicon) in the contact hole, and such a method has been studied. In a case where polycrystalline silicon is buried in the contact hole, it is required that a large amount of impurities be doped in polycrystalline silicon and the resistance of polycrystalline silicon be decreased. Generally, the above impurities are doped in polycrystalline silicon by an ion-implantation. However, an extremely high accelerating voltage is needed in order to implant an ion into a deep portion in the polycrystalline silicon. Due to this, there is a problem in that cost of an ion implantation device increases.

In a case where a plurality of contact holes are formed, and the contact holes are different in the depth, it is difficult to implant the ion into polycrystalline silicon in the all contact holes at the same time. In other words, it is impossible to evenly implant the ion into the polycrystalline silicon in the contact holes. This is because the ion cannot reach to the lower portion of polycrystalline silicon in the deep contact holes if the accelerating voltage is included in the shallow contact holes. For this reason, it is impossible to reduce the resistance value of the polycrystalline silicon in the deep contact holes.

For example, Unexamined Japanese Patent Application No. 1-205525 discloses the following points. The disclosure will be explained with reference to FIGS. 1A to 1F.

First of all, as shown in FIG. 1A, an impurity region, for example, a source region 303 of a MOS transistor is formed in a semiconductor substrate 301. An interlayer insulating film, for example, a silicon oxidation film 302 is formed on the entire surface of the semiconductor substrate 301. In the silicon oxidation film 302, there is formed a contact hole 304 reaching to the source region 303. Next, as shown in FIG. 1B, a polycrystalline silicon film 305 is formed on the entire surface of the silicon oxidation film 302 to be thinner than the half width of the contact hole 304. Then, as shown in FIG. 1C, impurities are doped in the polycrystalline silicon film 305 in the contact hole 304, so that the resistance value of a polycrystalline silicon film 305a in the bottom portion of the contact hole is reduced. Next, as shown in FIG. 1D, impurities are applied onto a polycrystalline silicon film 305b in order to reduce the resistance value of the polycrystalline silicon film 305b in the side wall of the contact hole 304. Then, as shown in FIG. 1E, a polycrystalline silicon film 306 is formed on the polycrystalline silicon film 305 by a CVD method, so that the contact hole is completely buried. Next, as shown in FIG. 1F, the polycrystalline silicon films 305 and 306 are etched back, so that the polycrystalline silicon films 305 and 306 is left in only the contact hole 304. Also, impurities, which are applied onto the polycrystalline silicon film 305b of the side wall portion in the contact hole 304, are thermally diffused to reduce the resistance value of the polycrystalline silicon film 306 in the contact hole 304. Thereby, polycrystalline silicon having low resistance is buried in the contact hole. Thereafter, a metal wire 307 is formed on the polycrystalline silicon films 305 and 306, and the source region 303 and the metal wire 307 are connected to each other.

According to the above method, the polycrystalline silicon films 305 and 306 are formed in the contact hole 304. Since the polycrystalline silicon films are thin, impurities can be easily doped into the polycrystalline films 305 and 306.

However, since impurities are doped into the polycrystalline silicon film 305, a natural oxidation film is formed on the surface of the polycrystalline silicon film 305 before the polycrystalline silicon film 306 is formed. Moreover, in general, there is formed the natural oxidation film between the semiconductor substrate 301 and the polycrystalline silicon film 305. Therefore, in the semiconductor device, which is formed by the above-mentioned method, two high resistors are sandwiched between the source region 303 and the metal wire 307, so that the contact resistance value is increased.

SUMMARY OF THE INVENTION

The present invention has been made to solve the above problems. An object of the present invention is to lower a contact resistance by burying low resistance material in a contact hole.

To achieve the above object, in a method for burying the contact hole according to the present invention, first of all, a polycrystalline silicon film is formed in the contact hole. Impurities are introduced into the polycrystalline silicon. Next, a low resistance film is formed on the polycrystalline silicon film. Another polycrystalline silicon film is formed on the low resistance film, thereby the contact hole is completely buried. Thereafter, a heating treatment is performed, so that impurities are diffused to the above two polycrystalline silicon films and a 10 whole or a part of the low resistance film is changed to a silicide film. Next, an etchback is performed, so that the polycrystalline silicon films and the silicide film are left in only the contact hole.

Also, in a method for burying the contact hole according to the present invention, first of all, a polycrystalline silicon film is formed in the contact hole. Impurities are introduced into the polycrystalline silicon. Next, a metal ion is implanted in the surface region of the polycrystalline silicon layer. Another polycrystalline silicon film is formed on the first polycrystalline silicon film, thereby the contact hole is completely buried. Thereafter, a thermal treatment is performed, so that impurities are diffused to the above two polycrystalline silicon films and a whole or a part of the metal ion is changed to a metal silicide film. Next, an etchback is performed, so that the polycrystalline silicon films and the metal silicide film are left in only the contact hole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A, 2B, 2C, 2D, 2E, 2F, 2G, 2H are cross sectional views showing a method relating to a first embodiment of the present invention;

FIGS. 6A, 6B, 6C are cross sectional views showing a method relating to a third embodiment of the present invention.

DETAILED DESCRIPTION OF THE PREFERRED EMBODIMENTS

Figure 1A:
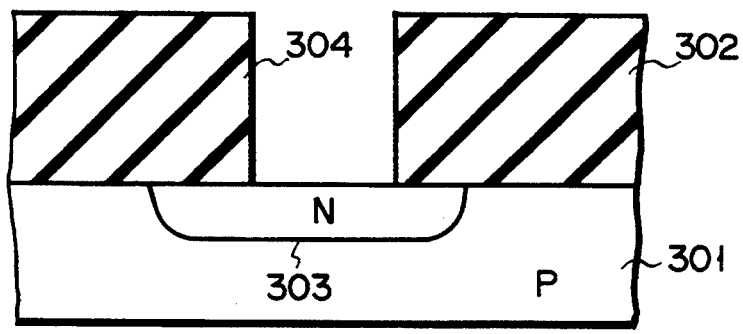
FIGS. 1A, 1B, 1C, 1D, 1E, 1F are cross sectional views showing conventional methods.
Figure 1B:
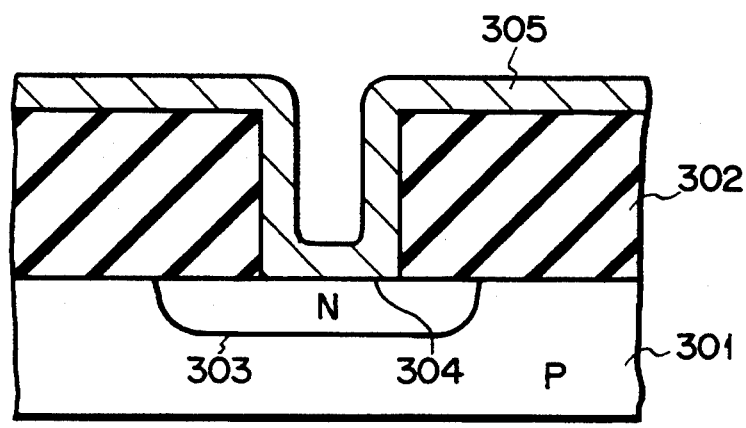
Figure 1C:
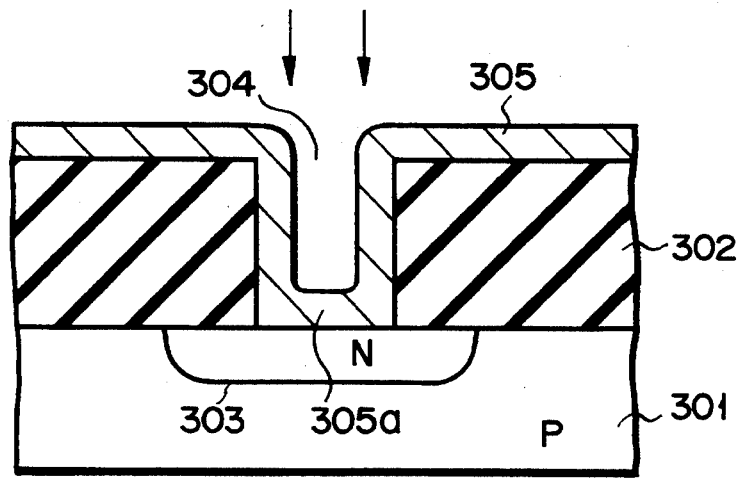
Figure 1D:
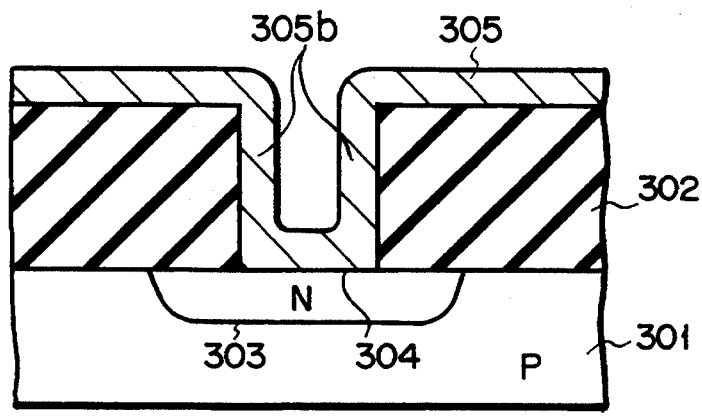
Figure 1E:
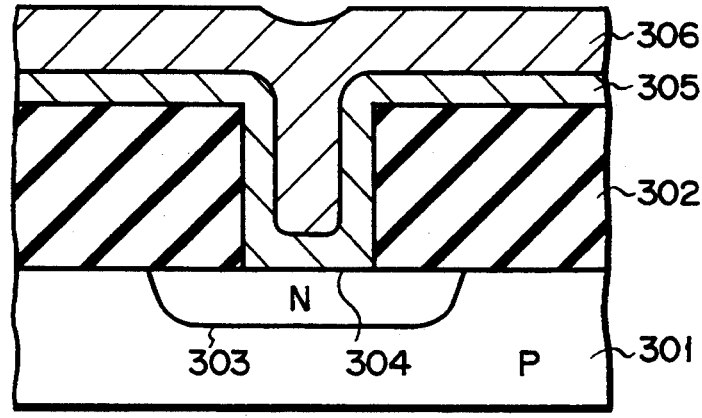
Figure 1F:
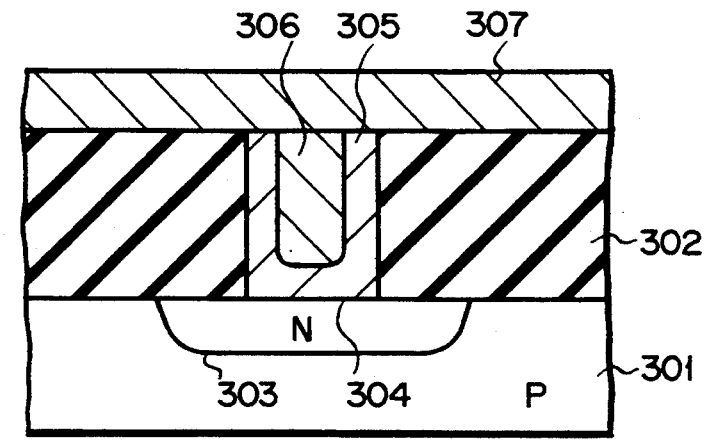

The embodiments of the present invention will be explained with reference to drawings.

FIGS. 2A to 2H are cross sectional views showing a method relating to a first embodiment of the present invention.

As shown in FIG. 2A, an N type impurity region 102 (for example, source region of MOS transistor) is formed on a surface region of a P type semiconductor substrate 101. An interlayer insulating film 103 (for example, silicon oxidation film) is formed on the entire surface of the semiconductor substrate 101. An insulating film 104 (silicon oxidation film) is formed on the interlayer insulating film 103. Thereafter, on the insulating films 103 and 104 there is formed a contact hole 105, which reaches to the impurity region 102.

As shown in FIG. 2B, a polycrystalline silicon film 106 having a thickness of about 500Å is formed on the entire surface exposed on the substrate by an LPCVD method. Additionally, the deposition of the polycrystalline silicon film 106 is performed a plurality of times. Thereafter, arsenic (As) is implanted into the polycrystalline silicon film 106. As a result, impurities are doped in the polycrystalline silicon film 106, and a natural oxidation film, which is formed between the impurity region 102 and the polycrystalline silicon film 106, is mixed, and disappears. In the polycrystalline silicon film in the contact hole, which reaches to a P type impurity region, BF2 is implanted (not shown). In order to implant the above ions (As, BF2), the following method is useful.

More specifically, the incident angle of the ion is set to be inclined against a normal line of the semiconductor substrate 101 at more than several degrees. Then, the ion is implanted as the semiconductor substrate 101 is rotated in its plane, In this case, impurities can be doped in the polycrystalline silicon film 106 in the contact hole 105 at the same time. Additionally, the formation of the polycrystalline silicon film 106 and the implantation of impurities is performed a plurality of times.

As shown in FIG. 2C, by use of a sputtering method, a titanium (Ti) film 107 having a thickness of about 200Å is formed on the polycrystalline silicon film 106. On the surface of the polycrystalline silicon film 106, there is formed a natural oxidation film ($SiO_2$) (not shown). In other words, a natural oxidation film is formed between the polycrystalline film 106 and the titanium film 107.

Figure 2D:
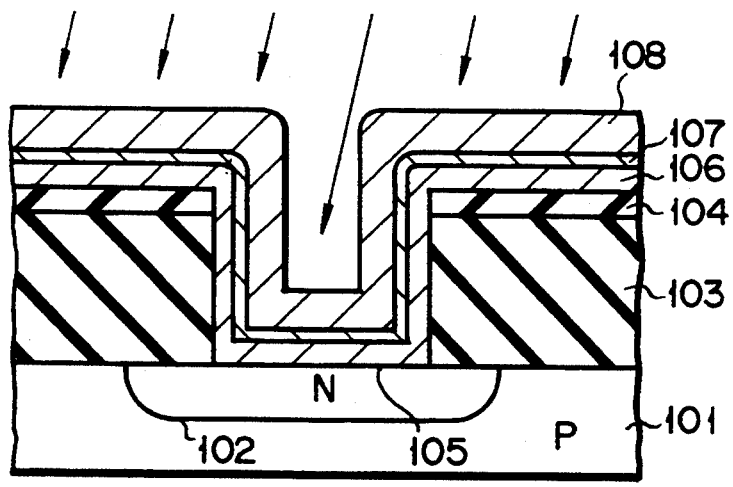

As shown in FIG. 2D, by use of LPCVD method, a polycrystalline silicon film 108 having a thickness of about 2000Å is formed on the entire surface exposed on the substrate. Thereafter, phosphorus (P) is implanted to the polycrystalline silicon film 108. At this time, the incident angle of phosphorus is set to be inclined against a normal line of the semiconductor substrate 101 at more than several degrees. Then, phosphorus is implanted as the semiconductor substrate 101 is rotated. In the polycrystalline silicon film in the contact hole, which reaches to the P type impurity region, boron (B) is implanted. This ion-implantation aims to reduce the resistance value of the polycrystalline film (described later in a heating treatment process described later.

Figure 2E:
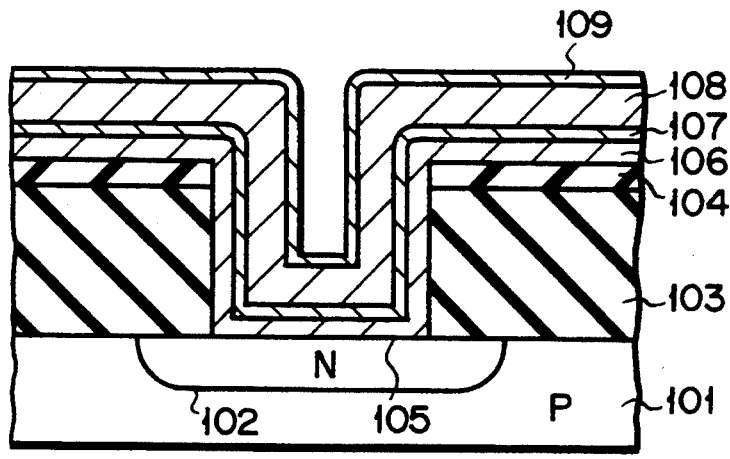

Next, as shown in FIG. 2E, by use of the sputtering method, a titanium (Ti) film 109 having a thickness of about 2000Å is formed on the polycrystalline silicon film 108. On the surface of the polycrystalline silicon film 108, there is formed a natural oxidation film ($SiO_2$) (not shown). In other words, a natural oxidation film is formed between the polycrystalline film 108 and the titanium film 109.

Figure 2F:
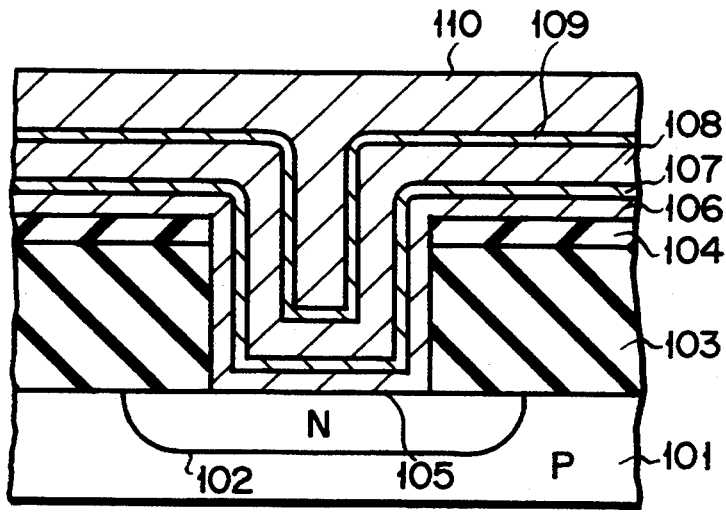

Next, as shown in FIG. 2F, by use of LPCVD method, a polycrystalline film 110 is formed on the entire surface exposed on the substrate, thereby the contact hole 105 is completely buried.

As shown in FIG. 2G, annealing is performed at temperature of about 850° C. in nitrogen atmosphere. Thereby, impurities, which are introduced by the above two-ion implantation, are diffused to the polycrystalline silicon films 106,108 and 110. At this time, since the titanium films 107 and 109 silicide-react with the polycrystalline silicon films 106,108 and 110, titanium silicide films ($TiSi_2$) 111 and 112 are formed. As a result, the natural oxidation film ($SiO_2$), which is formed between the titanium films 107,109 and the 10 polycrystalline silicon films 106, 108, is broken and disappears. The film thicknesses of the titanium films 107 and 109 and the heat treatment time are controlled in order that the silicide reaction does not advance to the impurity region 102, that is, the junction breakage of the impurity region 102 does not occur.

Next, as shown in FIG. 2H, the polycrystalline silicon films 106, 108, 110, and the titanium silicide films 111 and 112 are etched back, so that the polycrystalline silicon films and the titanium silicide films are kept in only the contact hole 105. At the time of etching back, the insulting film 104 prevents the polycrystalline silicon films and the titanium silicide films from being over-etched. In this case, as the insulating film 104, there is used material (for example, oxidation silicon) whose etching selection ratio is different from the material (for example, polycrystalline silicon) buried in the contact hole 105. Thereby, the material having low resistance is buried in the contact hole 105. Thereafter, a general wiring process is performed. That is, a metal wire (for example, wiring of the layers of Al—Si—Cu/-TiN/Ti) 113 is formed on the contact hole 105, and the impurity region 102 and the metal wire 113 are connected to each other.

In the heat treatment process according to the above-method, the titanium films 107 and 109 silicide-react with the polycrystalline silicon films 106, 108 and 110, so that titanium silicide films 111 and 112 are formed. Due to this, the natural oxidation film, which is formed between the titanium films 107, 109 and the polycrystalline silicon films 106,108, is broken and disappears. Also, since the resistance values of the titanium silicide films 111 and 112 are low, the contact resistance value can be decreased.

In the above-mentioned first embodiment, a titanium film can be formed between the semiconductor substrate 101 and the polycrystalline silicon film 106. However, in this case, the titanium silicide film often enters the impurity region 102 by the silicide reaction between the semiconductor substrate 101 and the titanium film. This causes the induction of the junction leakage. Therefore, it is favorable that the natural oxidation film, which is formed between the semiconductor substrate 101 and the polycrystalline silicon film 106, disappear by the mixing using the ion-implantation as mentioned above.

Moreover, according to the first embodiment, the etchback is performed after the impurities are thermally diffused. This is because the impurities are diffused from the polycrystalline silicon films 106 and 108 in the vicinity of the contact hole 105, thereby increasing the concentration of the impurity of the polycrystalline silicon film 110 of the upper portion of the contact 10 hole 105. As a result, the contact resistance value can be decreased as compared with the case in which the impurities are thermally diffused after the etchback is performed.

Figure 3:
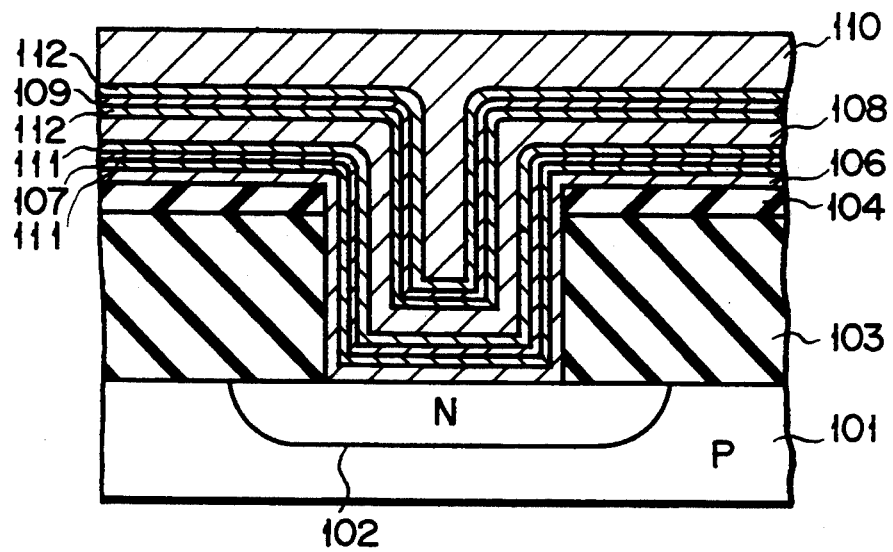
FIG. 3 is a cross sectional view showing a method relating to a modification of the first embodiment.
Figure 4:
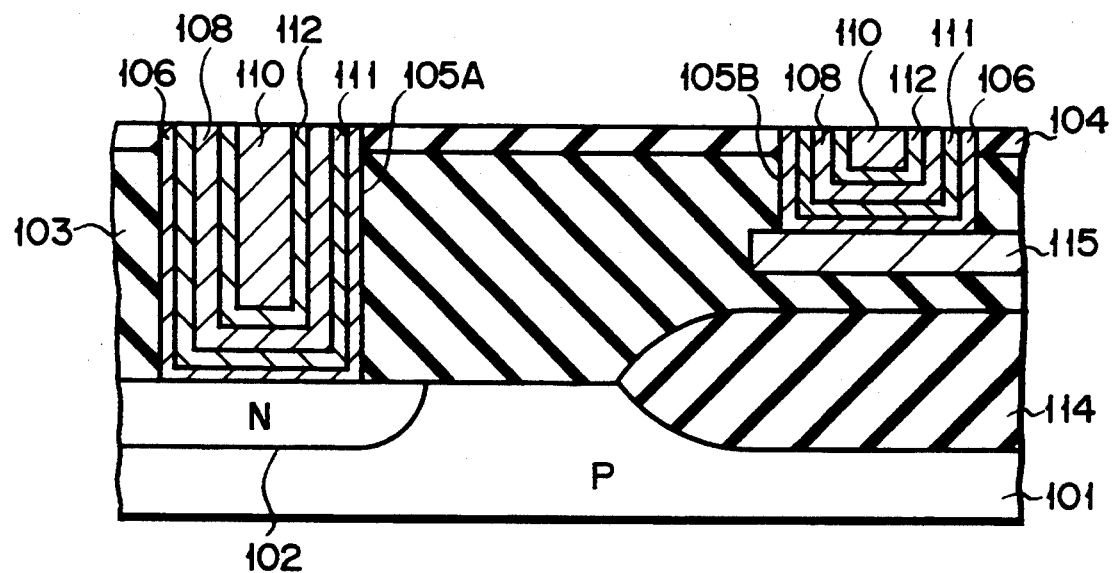
FIG. 4 is a cross sectional view showing a semiconductor device to which the method relating to the first embodiment is applied.

Moreover, as shown in FIG. 3, in the heat treatment process, since the titanium films 107 and 109 cannot be silicide-reacted with the polycrystalline silicon films 106, 108, 110, the titanium films 107 and 109 may be partially left. However, the silicide reaction is performed until the natural oxidation film, which is formed between the polycrystalline silicon films 106, 108 and the titanium films 107 and 109, is completely broken. FIG. 4 is a case to which the method of the above-mentioned first embodiment to a MOS transistor is applied. In this drawing, reference numeral 114 is a field oxidation film, and reference numeral 115 is a gate electrode. According to the present invention, the material having low resistance can be buried in contact holes 105A and 105B having a different depth, and the contact resistance value is not increased by the natural oxidation film.

Figure 5A:
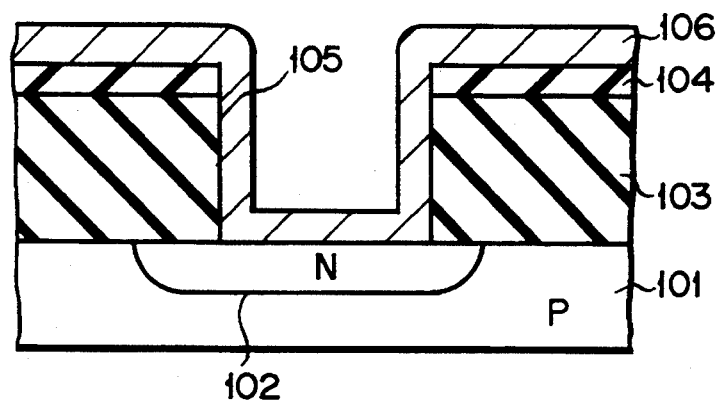
FIGS. 5A, 5B, 5C are cross sectional views showing a method relating to a second embodiment of the present invention.
Figure 5B:
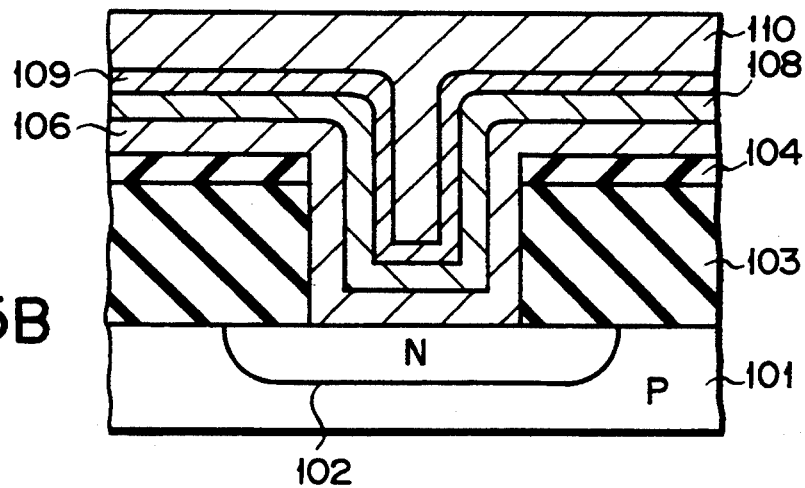
Figure 5C:
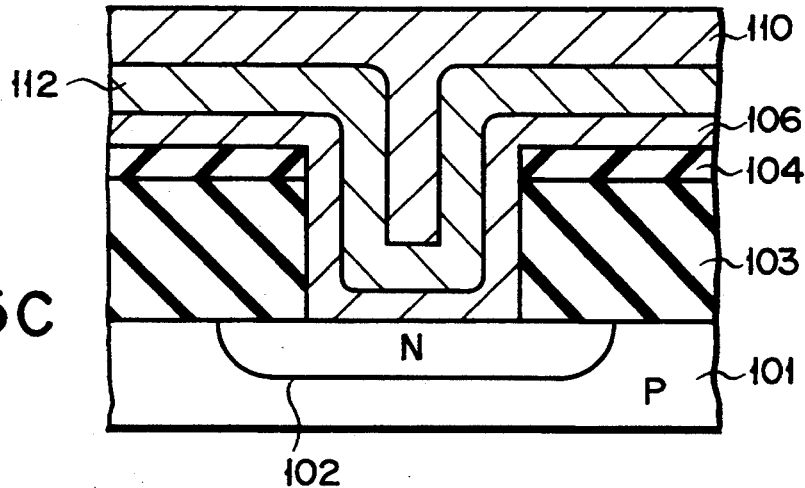

FIGS. 5A to 5C show a method relating to a second embodiment of the present invention.

As shown in FIG. 5A, the formation of the polycrystalline film 106 is performed by the same method as that of the above-first embodiment. Next, as shown in FIG. 5B, the polycrystalline silicon film 108 is formed on the entire surface exposed on the substrate by LPCVD method. Also, phosphorus (P) is implanted to the polycrystalline film 108. Thereafter, by use of the sputtering method, the titanium film 109 is formed on the polycrystalline silicide film 108. Also, by use of LPCVD method, the polycrystalline silicon film 110 is formed on the entire surface exposed on the substrate, thereby the contact hole 105 is completely buried. Next, as shown in FIG. 5C, the heat treatment process is performed, so that the impurities in the polycrystalline silicon films 106 and 108 are diffused to the polycrystalline silicon film 110. At this time, the titanium film 109 is silicide-reacted with the polycrystalline silicon films 106 and 108, thereby the titanium silicide film ($TiSi_2$) 112 is formed. The thickness of the titanium film 109 is decided by the condition in which the titanium silicide film 112 reaches to the boundary surface between the polycrystalline silicon film 106 and the polycrystalline silicon film 108. As a result, the natural oxidation film ($SiO_2$), which is formed between the polycrystalline silicon film 106 and the polycrystalline silicon film 108, and the natural oxidation film, which is formed between the polycrystalline silicon film 108 and the titanium film 109, are broken and disappear. Thereafter, the polycrystalline silicon films 106, 108, 110 and the titanium silicide film 112 are etched back (not shown). Also, the metal wire (for example, wiring of the layers of Al—Si—Cu/TiN/Ti) 113 is formed on the contact hole 105, and the impurity region 102 and the metal wire 113 are connected to each other.

According to the method, the same effect as that of the first embodiment can be obtained. In the above second embodiment, the titanium film 109 may be formed between the polycrystalline silicon films 106 and 108. Also, if the impurities are introduced into the polycrystalline silicon film 106, the impurities may also be introduced into the polycrystalline silicon film 106 at the same time. In this case, there is not performed the process for introducing the impurities to only the polycrystalline silicon film 106.

In the above-mentioned first and second embodiments, the titanium film is formed on the polycrystalline silicon film in order to form the titanium silicide film. In place of the above methods, a refractory metal ion is implanted and a refractory metal silicide film may be formed in the heat treatment process performed later.

More specifically, as shown in FIG. 6A, for example, the titanium ion is implanted in the polycrystalline silicon film 106, and a titanium ion layer 107I is formed in the surface region of the polycrystalline silicon film 106. Thereafter, as shown in FIG. 6B, the polycrystalline silicon film 108 is formed on the entire surface exposed on the substrate. Also, for example, the titanium ion is implanted in the polycrystalline silicon film 108, and a titanium ion layer 109I is formed in the surface region of the polycrystalline silicon film 108. Thereafter, as shown in FIG. 6C, the burial of the contact hole 105 is performed by the same method as that of the abovementioned first embodiment. As a resole, the impurity region 102 and the metal wire 113 are connected to each other.

Moreover, in the above-mentioned first and second embodiments, the titanium film is formed on the polycrystalline silicon film. In place of this formation, other refractory metal such as tungsten (W), molybdenum (Mo), cobalt (Co) and the like may be formed thereon. Also, a refractory metal silicide film such as $TiSi_2$, $WSi_2$, $MoSi_2$ and the like may be formed thereon. Moreover, a refractory ion may be implanted in place of the point that the refractory metal film is formed.

Furthermore, the present invention is not limited to the case in which the contact hole on the impurity region is buried. The present invention can be applied to the case in which the contact hole is buried in order to connect a lower layer wire to an upper layer wire in a multi-layer wiring structure.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of providing a contact to a conductive region of a semiconductor device, the method comprising the steps of:
    a first step of forming an insulating film on a conductive region of a semiconductor device;
    a second step of forming a contact hole in said insulating film exposing said conductive region;
    a third step of forming a first polysilicon film on said insulating film and said contact hole, introducing impurities into said first polysilicon film, and forming a first conductive film Comprising a metal on said first polysilicon film, said third step being performed at least one time;
    a fourth step of forming a second polysilicon film on an upper surface of said first conductive film to bury said contact hole;
    a fifth step of heating to diffuse said impurities and to form a metal silicide film breaking down respective natural oxidation films between said first polysilicon film and said first conductive film and between said first conductive film and said second polysilicon film, said metal silicide film being formed between said first polysilicon film and said second polysilicon film by reaction of said first conductive film to said first polysilicon film and said second polysilicon film; and
    a sixth step of etching said first polysilicon film, said second polysilicon film, and said metal silicide film to provide a contact within said contact hole; and
    a seventh step of forming a second conductive film on said contact and said insulating film.

2. The method according to claim 1, wherein said first conductive film is formed by a sputtering method.

3. The method according to claim 1, wherein said first conductive film is a refractory metal film.

4. The method according to claim 1, wherein said first conductive film is a metal silicide film.

5. The method according to claim 1, wherein said conductive region is a semiconductor region in a semiconductor material.

6. The method according to claim 1, wherein said conductive region is a gate electrode.

7. A method of providing a contact to a conductive region of a semiconductor device, the method comprising the steps of:
    a first step of forming an insulating film on a conductive region of a semiconductor device;
    a second step of forming a contact hole in said insulating film exposing said conductive region;
    a third step of forming a first polysilicon film on said insulating film and said contact hole, introducing impurities into said first polysilicon film, and forming a first conductive film comprising a metal on said first polysilicon film, said third step being performed at least one time;
    a fourth step of forming a second polysilicon film on an upper surface of said first conductive film to bury said contact hole;
    a fifth step of heating to diffuse said impurities and to form metal silicide films breaking down respective natural oxidation films between said first polysilicon film and said first conductive film and between said first conductive film and said second polysilicon film, said metal silicide films being formed between said first polysilicon film and said first conductive film and between said first conductive film and said second polysilicon film, respectively, by reaction of said first conductive film to said first polysilicon film and said second polysilicon film;
    a sixth step of etching said first polysilicon film, said second polysilicon film, and said metal silicide film to provide a contact within said contact hole; and
    a seventh step of forming a second conductive film on said contact and said insulating film.

8. The method according to claim 7, wherein said first conductive film is formed by a sputtering method.

9. The method according to claim 7, wherein said first conductive film is a refractory metal film.

10. The method according to claim 7, wherein said first conductive film is a metal silicide film.

11. The method according to claim 7, wherein said conductive region is a semiconductor region in a semiconductor material.

12. The method according to claim 7, wherein said conductive region is a gate electrode.

13. A method of providing contacts to conductive regions of a semiconductor device, the method comprising the steps of:
    a first step of forming an insulating film on a first conductive region and a second conductive region of a semiconductor device;
    a second step of forming a first contact hole in said insulating film exposing said first conductive region and forming a second contact hole in said insulating film exposing said second conductive region, a depth of said first contact hole being different than a depth of said second contact hole;
    a third step of forming a first polysilicon film on said insulating film, said first contact hole, and said second contact hole, introducing impurities into said first polysilicon film, and forming a conductive film comprising a metal on said first polysilicon film, said third step being performed at least one time;
    a fourth step of forming a second polysilicon film on an upper surface of said conductive film to bury said first contact hole and said second contact hole;
    a fifth step of heating to diffuse said impurities and to form a metal silicide film breaking down respective natural oxidation films between said first polysilicon film and said conductive film and between said conductive film and said second polysilicon film, said metal silicide film being formed between said first polysilicon film and said second polysilicon film by reaction of said conductive film to said first polysilicon film and said second polysilicon film; and
    a sixth step of etching said first polysilicon film, said second polysilicon film, said conductive film, and said metal silicide film to provide a contact within said first contact hole and to provide a contact within said second contact hole.

14. The method according to claim 13, wherein said conductive film is formed by a sputtering method.

15. The method according to claim 13, wherein said conductive film is a refractory metal film.

16. The method according to claim 13, wherein said conductive film is a metal silicide film.

17. The method according to claim 13, wherein said first conductive region is a semiconductor region in a semiconductor material and said second conductive region is a gate electrode.

* * * * *

UNITED STATES PATENT AND TRADEMARK OFFICE
CERTIFICATE OF CORRECTION

PATENT NO. : 5,420,074

DATED : May 30, 1995

INVENTOR(S) : Yoichi OHSHIMA

It is certified that error appears in the above-identified patent and that said Letters Patent is hereby corrected as shown below:

On the title page:

Item: [75] on the first page of the patent, "Yoich" should be --Yoichi--.

Signed and Sealed this

Twenty-second Day of August, 1995

Attest:

BRUCE LEHMAN

Attesting Officer

Commissioner of Patents and Trademarks